United States Patent
Kröll

(10) Patent No.: US 11,680,999 B2
(45) Date of Patent: Jun. 20, 2023

(54) METHOD FOR OPERATING A MAGNETIC RESONANCE DEVICE, MAGNETIC RESONANCE DEVICE, COMPUTER PROGRAM AND ELECTRONICALLY READABLE DATA STORAGE MEDIUM

(71) Applicant: Siemens Healthcare GmbH, Erlangen (DE)

(72) Inventor: Maria Kröll, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/704,238

(22) Filed: Mar. 25, 2022

(65) Prior Publication Data
US 2022/0308143 A1    Sep. 29, 2022

(30) Foreign Application Priority Data
Mar. 25, 2021   (DE) ............ 10 2021 202 958.2

(51) Int. Cl.
*G01R 33/54*   (2006.01)

(52) U.S. Cl.
CPC ......... *G01R 33/543* (2013.01); *G01R 33/546* (2013.01)

(58) Field of Classification Search
CPC ........................... G01R 33/543; G01R 33/546
See application file for complete search history.

(56) References Cited

U.S. PATENT DOCUMENTS

| | | | |
|---|---|---|---|
| 2003/0095150 A1* | 5/2003 | Trevino | G01R 33/546 715/810 |
| 2007/0098240 A1* | 5/2007 | Takayama | G01R 33/54 382/128 |
| 2008/0104533 A1* | 5/2008 | List | A61B 5/055 715/771 |
| 2013/0145314 A1* | 6/2013 | Dhar | A61B 6/4405 715/803 |

* cited by examiner

*Primary Examiner* — G. M. A Hyder
(74) *Attorney, Agent, or Firm* — Banner & Witcoff Ltd.

(57) ABSTRACT

In a method for operating a magnetic resonance device, change information, which describes newly available and/or modified operating options compared with the previous version of user interface software means for at least one of the at least one user interfaces, is received and/or is determined from received update information; and the output means of an operator device is controlled according to the change information to display in a highlighted manner the newly available and/or modified operating options at least when the user interface and/or a further user interface, which is assigned on the basis of the change information, is invoked for the first time.

16 Claims, 2 Drawing Sheets

METHOD FOR OPERATING A MAGNETIC RESONANCE DEVICE, MAGNETIC RESONANCE DEVICE, COMPUTER PROGRAM AND ELECTRONICALLY READABLE DATA STORAGE MEDIUM

CROSS REFERENCE TO RELATED APPLICATIONS

This patent application claims priority to German Patent Application No. 102021202 958.2, filed Mar. 25, 2021, which is incorporated herein by reference in its entirety.

BACKGROUND

Field

The disclosure relates to a method for operating a magnetic resonance device, which has an operator device that is for the input of at least one operating parameter and has at least one output means, and a controller for the operator device and for controlling the magnetic resonance device in accordance with operating parameters set by means of the operator device. The disclosure also relates to a magnetic resonance device, to a computer program and to an electronically readable data storage medium.

Related Art

Magnetic resonance devices are commonly used now for medical imaging in many sectors. In this context, the operational control of magnetic resonance devices, for instance setting the acquisition parameters, in particular sequence parameters for magnetic resonance sequences, continues to present a challenge to many users because of the high level of complexity. Therefore, a large amount of research effort has been directed at creating operator devices for magnetic resonance devices, by means of which the acquisition parameters and other operating parameters of the magnetic resonance device can be set in a manner that is comprehensible, simple and transparent as far as possible for all users. This effort to create objectively improved operator devices for magnetic resonance devices also involves regular updates of user interface software means, which provide user interfaces (UIs) for the operational control on an output means of the operator device and which receive relevant user inputs. Such updates can be performed also as part of the update of overall software for a magnetic resonance device.

An update of the user interface software means in many cases brings with it new and/or modified, in particular improved, operating options, which can be used by the user to set operating parameters of the magnetic resonance device. The high level of complexity of operational control, in particular for magnetic resonance imaging, where, for example, it is possible to set a large number of acquisition parameters, some of which are interrelated and some of which can also be set in groups, means that it can easily happen in the case of magnetic resonance devices that new operating options, for example also minor improvements, are not immediately obvious to the users. In particular this can also result in a user entirely failing to notice simplifications, improvements and even new operating capabilities.

As a solution to this problem it has been proposed to offer, in particular with every new software update, training sessions for customers and users, some of which are also focused on specific aspects of the technical operational control of the magnetic resonance device. These are time-consuming and costly to carry out, however; nor can it be guaranteed that participants pay attention throughout and/or that every user actually takes part. In addition, Help files, manuals and such like exist but are rarely read by users. Lastly, updates are often accompanied by update information, for instance release notes and/or delta lists, but which again is often not read by application specialists/users.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
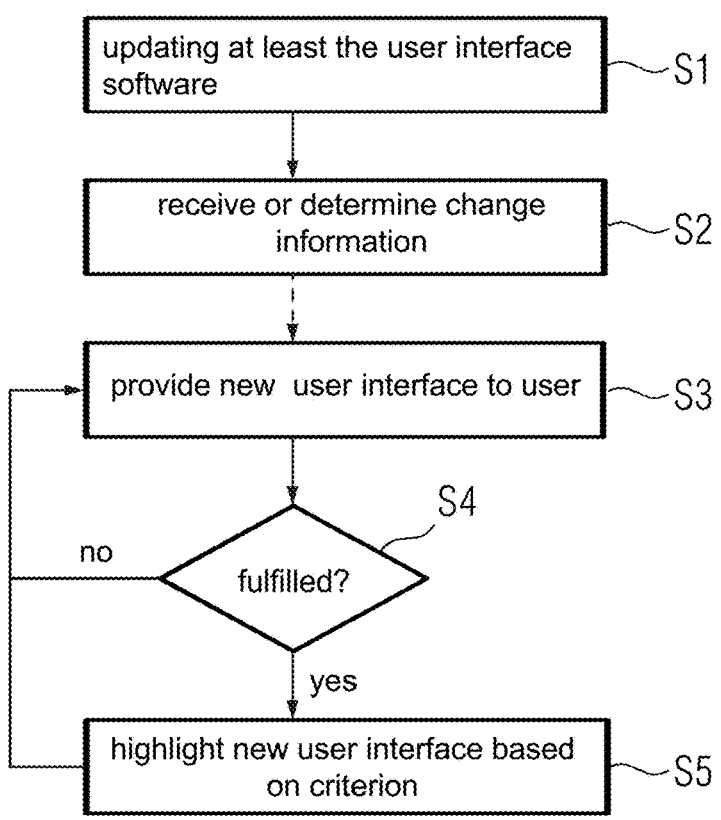
FIG. 1 shows a flowchart of a method according to an exemplary embodiment of the disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

An object of the disclosure is to facilitate technical operational control of magnetic resonance devices that is objectively improved, in particular in terms of new and/or modified operating capabilities.

This object is achieved by providing a method, a magnetic resonance device, a computer program and an electronically readable data storage medium as described in the present disclosure.

In a method of the type mentioned in the introduction, it is provided according to the disclosure, when updating the user interface software means to a new version, that:

change information, which describes newly available and/or modified operating options compared with the previous version of the user interface software means for at least one of the at least one user interfaces, is received and/or is determined from received update information; and in particular at least for a display option activated by a user, the output means of the operator device is controlled according to the change information to display in a highlighted manner the newly available and/or modified operating options at least when the user interface and/or a further user interface, which is assigned on the basis of the change information, is invoked for the first time.

It is therefore proposed to make new and/or improved operating options provided by the new version of the user interface software means easily and intuitively identifiable to a user. This is done by using and determining change information, according to which, for example, at least one newly available and/or modified operating option is labeled, if applicable with an assignment to its user interface or an additional assignment to a further user interface, as will be explained in greater detail. The change information can be provided directly by the installation of the updated user interface software means, although it is also possible for the controller to analyze automatically update information, in particular received with the installation of the updated user interface software means, in order to determine the change information. Operating options that are newly available and/or have been modified are often identified by name in such update information, and therefore it is possible to use a suitable analysis algorithm, for instance text analysis, to derive change information also automatically. For example, the update information may be release notes, and therefore the change information can be determined by automatic analysis of release notes as the update information.

On the basis of the labels in the change information, the newly available and/or modified operating options can be made visible in corresponding user interfaces in such a way that they are discerned at first glance as soon as a user opens the corresponding user interface. It should be mentioned here that an embodiment is conceivable in which a corresponding display option can be enabled or disabled by a user. This means that the display option provides the user with the facility to disable the highlighted view of these operating options. This can also be done by group and/or area, allowing the user to customize which operating options are displayed according to their requirements. It is thereby possible overall to reach the entire target group of users and to inform this group appropriately about newly available and/or modified operating options. This contrasts with training sessions, for example, which reach only part of the target group, with the added possibility that training content is forgotten by the time the relevant operating option is actually needed. The embodiment according to the disclosure makes it possible to provide and specifically point out operating options precisely at the time at which they are of interest. Nonetheless, the user can of course be given the option to remove the highlighting and/or the operating option deliberately at any time.

In a particularly advantageous development of the present disclosure, the at least one user interface for which at least one newly available and/or modified operating option is ready, and/or at least one user interface from which can be invoked the at least one user interface for which at least one newly available and/or modified operating option is ready, can be displayed in a highlighted manner in at least one higher-level user interface in which it can be invoked. In other words, the disclosure can also provide particularly advantageously that the user interfaces (or operating options that select these) in which the newly available and/or modified operating options are then ready, are highlighted. The user thereby receives information, even before selecting the corresponding user interface, that when they open the user interface, they will be notified of a new and/or modified operating facility. Of course, this can also be extended hierarchically, for instance so that user interfaces from which can be invoked user interfaces in which the newly available and/or modified operating options are ready, are highlighted in order that, particularly advantageously, the path to finding the changes is ultimately clearly visualized to the user. It can be expedient in this context to perform this highlighting of selectable user interfaces (or the operating option that selects them) only for the first respective invocations and/or to maintain this highlighting only until the relevant user interface has been invoked in which at least one newly available and/or modified operating option is ready.

In a further expedient embodiment, it can be provided that the display option, so provided, is presented in a settings interface such that it can be enabled and disabled. The user is thereby guaranteed control over the operating support provided to them.

In an exemplary embodiment, the change information is assigned at least one, in particular user-modifiable, time-length criterion, in particular a maximum number of invocations of the user interface and/or of the operating option and/or a maximum timespan after the update, with the highlighted display taking place after the first invocation of the corresponding user interface only if the time-length criterion is fulfilled. In other words, it can be stipulated, for example, that the highlighting, and hence the pointer to the newly available and/or modified operating option, is meant to take place only for a certain number of invocations of the corresponding user interface and/or only for a certain timespan, for instance for one to four weeks after the update of the user interface software means. It is possible in any case to provide additionally a time-length criterion that ends the highlighting once another update takes place, i.e. a newer version is installed and the formerly new version becomes the previous version. In addition to the at least one time-length criterion being specified by a controller, it is obviously also conceivable for this to be configured to be modified by a user, for instance in the aforementioned settings interface.

In particular, it can also be provided that time-length criteria assigned to different highlightings are used for at least some of the newly available and/or modified operating options. Hence, for example, a newly available and/or modified operating option can still have a flashing border for highlighting when a user interface is first invoked, but thereafter just has the border without flashing, and suchlike. This avoids unnecessary distraction of the user, who has taken notice of the newly available and/or modified operating option but may not want to use it at that time.

A particularly advantageous embodiment of the present disclosure is obtained if at least one acquisition parameter related operating option of the at least one newly available and/or modified operating option relates to setting an acquisition parameter for an acquisition process of the magnetic resonance device as an operating parameter, which acquisition parameter related operating option is assigned to at least one acquisition parameter menu as a user interface. As already explained, with regard to the acquisition parameters, in particular also the sequence parameters for magnetic resonance sequences or acquisition protocols to be set, the range of setting options is large, and therefore especially in such a case, users for conventional magnetic resonance devices may possibly fail to notice that an additional operating option is available in a sub-level after a software update. The present disclosure provides a remedy here by pointing to such newly available and/or modified operating options in a targeted manner. Because of the high complexity of the setting, it is common to provide a plurality of acquisition parameter menus, across which are distributed all the potential acquisition parameters for a certain acquisition protocol. Although numerous potentially available acquisition parameters are universal to all acquisition protocols, a significant number of acquisition parameters also depend on the specific acquisition protocol or the specific magnetic resonance sequences.

In this regard, in conventional approaches may include a plurality of acquisition parameter menus having a main acquisition parameter menu that is displayed first when a function for setting acquisition parameters (or setting an acquisition protocol) is selected. For example, the acquisition parameter menus can be displayed in the form of tabs, wherein the main acquisition parameter menu forms the first tab and contains the most important acquisition parameter operating options. The operating options assigned generally to the main acquisition parameter menu can be already hard-coded during development, in particular for standard acquisition protocols, although user-configurable user interfaces have already been proposed here, in which a user can fill at least a portion of the main acquisition parameter menu with operating options.

In this context, according to an exemplary embodiment, so if a plurality of user interface software means are provided, where a main acquisition parameter menu of the acquisition parameter menus is displayed first on selection of a function for setting acquisition parameters, which function can also be assigned in particular to an acquisition protocol, irrespective of a specified assignment of the acquisition parameter related operating option to another of the acquisition parameter menus, according to the change information, the acquisition parameter related operating option is displayed in a highlighted manner in the main acquisition parameter menu, in particular in a predefined view area. The main acquisition parameter menu thus forms one of the aforementioned further user interfaces, which can additionally be assigned to acquisition parameter related operating options on the basis of the change information. In other words, newly available and/or modified operating options can thereby be displayed and highlighted automatically on the acquisition parameter menu that is displayed first, irrespective of whether a standard acquisition protocol, a user-defined acquisition protocol or a highly specific acquisition parameter is involved or irrespective of the configuration made by the user. The user can then decide whether they want to retain the new and/or modified operating option on this acquisition parameter menu or whether it is meant to be removed again from this acquisition parameter menu. For such acquisition parameter related operating options, a predefined view area can be provided in the main acquisition parameter menu, for instance adjacent to, overlapping, or according to a configuration area which is user-configurable anyway.

As already described, it can be provided that the acquisition parameter related operating option is removed again from the acquisition parameter menu on detection of a specified operating action. Hence, as described, the user can decide at any time whether they want to retain the newly available and/or modified operating option in the main acquisition parameter menu or whether it is meant to be present only in its default acquisition parameter menu.

In an exemplary embodiment, on detection of a predefined user interaction with one of the at least one acquisition parameter related operating options displayed in a highlighted manner in the main acquisition parameter menu, the other acquisition parameter menu (default acquisition parameter menu), for which this operating option is intended, can be displayed in a highlighted manner. For example, if the user considers the newly available and/or modified operating option to be basically of interest but does not want it retained in the main acquisition parameter menu, it can thereby be conveyed to them by a simple user interaction, for instance in a context menu or by a certain operating gesture, where to find the operating option should they seek it later.

An exemplary embodiment also provides that in addition to the highlighted display in the main acquisition parameter menu, the at least one acquisition parameter related operating option is also displayed in a highlighted manner in the other of the acquisition parameter menus. The newly available and/or modified operating option obviously has, according to the user interface software means, also a default position on one of the other acquisition parameter menus (i.e. a default acquisition parameter menu) for setting the acquisition parameters, wherein in an expedient development of the disclosure, the acquisition parameter related operating option can be made more visible and more discernible to a user also in this other acquisition parameter menu by highlighting, for instance by an appropriate indicator in the acquisition parameter menu. The user can thereby easily learn where to find the acquisition parameter related operating option if it is not meant to be retained on the main acquisition parameter menu. In this context, an expedient development can also provide that on detection of a predefined user interaction with an acquisition parameter related operating option that is displayed in a highlighted manner on the main acquisition parameter menu, the other of the acquisition parameter menus that is assigned to this acquisition parameter related operating option is shown with additional highlighting of said operating option.

As already stated, at least part of the main acquisition parameter menu can be user-configurable, in particular in a configuration area, and/or can have at least one operating option for setting a higher-level acquisition parameter that affects a plurality of sequence parameters of a magnetic resonance sequence. In particular, simplified setting options can be present on the main acquisition parameter menu, for instance concerning the total acquisition duration, a desired resolution, a desired contrast and such like.

In an exemplary embodiment of the present disclosure, it can also be provided that in order to determine at least some of the other operating options to be displayed on at least one of the acquisition parameter menus, in particular the main acquisition parameter menu, usage information describing the past usage behavior with regard to the at least one acquisition parameter menu is analyzed. In addition to the automatic highlighting of new features and modifications, it can thus also be provided to track user needs. For example, if a user often adjusts a certain acquisition parameter, the corresponding operating option should be prominently presented, for instance on the main acquisition parameter menu. In addition, those other operating options displayed there, for instance in the configuration area and/or view area, may obviously be removed or retained by the user. It is thereby possible to consider past user behavior in order to improve further the technical operational control of the magnetic resonance device.

Of course, the concept described here according to the disclosure can also be employed expediently outside acquisition parameter menus. For instance, it can be provided in another example that at least one of the at least one newly available and/or modified operating options relates to a tool, which newly available and/or modified operating option is shown in a favorites view area for user-preferred tools, which area in particular is user-configurable. Operating options that are thus displayed as tool icons, for instance, can be highlighted in a corresponding display area, for example in the favorites view area, in a similar manner to the acquisition parameter related operating options. In particular, instead of being hidden in a tool gallery, a new and/or modified operating option relating to a tool can be accommodated in favorite, i.e. user-preferred, tools, for instance in a highlighted manner, from where, of course, it can be removed again by the user as required (and after having been noticed).

Various options are conceivable for the highlighting. For instance, it can be provided that the highlighting is performed by using a border and/or coloration and/or a background and/or lettering and/or dynamically, in particular by pulsating and/or flashing. For example, newly available and/or modified operating options can thus be framed by an in particular colored and/or dynamically animated border, and/or, for example, be given a background surface that is in particular colored and/or dynamically animated. Of course, it is also possible to display small icons or lettering next to the operating option, for example as a colored dot and/or the lettering "new", which may also be highlighted pictorially.

The present disclosure relates not only to the method but also to a magnetic resonance device, having:
- an operator device that is for the input of at least one operating parameter and has at least one output means; and
- a controller for the operator device and for controlling the magnetic resonance device in accordance with operating parameters set by means of the operator device, wherein the controller is configured to perform the method according to the disclosure.

All the statements relating to the method according to the disclosure apply analogously to the magnetic resonance device according to the disclosure, and therefore the aforementioned advantages can likewise be achieved by said device. The controller can comprise in particular at least one processor and/or at least one storage means. The different steps of the method according to the disclosure can be implemented by function units, for example a first interface for receiving change information and/or update information, optionally a determination unit for determining the change information from the update information, a checking unit for checking time-length criteria and/or a highlighting unit for appropriate highlighting.

A computer program according to the disclosure can be loaded directly into a controller of a magnetic resonance device, and comprises program means to perform the steps of a method according to the disclosure when the computer program is executed in the controller of the magnetic resonance device. The computer program can be stored on an electronically readable data storage medium, which therefore comprises control information that comprises a computer program according to the disclosure and is configured such that when the data storage medium is used in a controller of a magnetic resonance device, this device performs the steps of a method according to the disclosure. The electronically readable data storage medium may be a non-transient data storage medium, for instance a CD-ROM.

FIG. 1 is a flow diagram of a method according to an exemplary embodiment of the disclosure. This is used to operate a magnetic resonance device, in which, by means of an operating facility having an output means and an input means, can be input operating parameters, according to which the magnetic resonance device is meant to be operated. The operation of the magnetic resonance device and hence also of the operator device is controlled by means of a controller, which also uses for the subsequent operation the set operating parameters. Operating parameters are set at least in part using user interfaces, which are output on the output means, for example a display or monitor. The user interfaces are produced by user interface software means of the controller.

Step S1 relates to the general process of updating at least the user interface software means, in particular also the overall software of the magnetic resonance device. This means that the software version increases from a previous version to a new version. This can also include changes relating to the operating options available via the user interfaces for setting the operating parameters, which means that new operating options can be added and/or existing operating functions can be modified, in particular improved.

Therefore, in step S2, change information is received by the controller or is determined from update information. The change information labels newly available and/or modified operating options as such. An assignment to a further user interface can also be included. For example, each modified and/or newly available operating option can have a fixed, allocated place in a user interface (default user interface). For the subsequent identification and especially also recognition, however, it can be expedient to assign, at least temporarily, the newly available and/or modified operating option also to a further user interface, for instance in the case of an acquisition parameter related operating option used for setting acquisition parameters for an acquisition process, in a main acquisition parameter menu that is shown first on selection of a function for setting acquisition parameters and assigned in particular to an acquisition protocol.

In particular when only alternative update information, for instance release notes, is supplied with the new version of the user interface software means, it can be provided in a corresponding variant of the method according to the disclosure to derive the change information by analyzing same, because newly added and/or modified operating options are usually mentioned or described there explicitly. This can be done using a text analysis algorithm, for example.

Step S3 symbolizes the subsequent general use, here specifically operational control, of the magnetic resonance device using the user interfaces. If in this process, a user interface that contains a newly available and/or modified operating option is meant to be shown, and/or an operating option for (if applicable also indirect) selection of a user interface that contains a newly available and/or modified operating option is meant to be shown, the fulfillment of various time-length criteria and a first invocation criterion is checked in step S4. If the first-invocation criterion is fulfilled, the newly available and/or modified operating option, or the operating option for invoking a user interface containing a newly available and/or modified operating option, is always displayed in a highlighted manner in step S5. Outside of this first invocation, the highlighting in step S5 continues provided all the time-length criteria, or all the time-length criteria assigned to a highlighting type, are fulfilled and no other user setting contradicts this (for instance an operating option was removed under user control from a user interface). A fixed time-length criterion can ensure, for example, that the highlighting takes place at most until the next software update. Other time-length criteria, which may also be configured to be adjusted by a user, can relate to the number of invocations of the corresponding user interface and/or a timespan from the update of the user interface software means, for example.

It is obviously also possible, for example by means of the change information, for different time-length criteria to be assigned to different newly added and/or modified operating options and/or user interfaces, and/or for time-length criteria to relate to different highlighting types. For example, in the case of highlighting operating options for selecting user interfaces in which newly added and/or modified operating options are present, the highlighting can be limited in the sense of taking place only until the first selection. Different time-length criteria can also be used for different types of newly added and/or modified operating options, for example for acquisition parameter related operating options and for operating options relating to a software tool.

The change information in the present exemplary embodiment in particular relates to those newly available and/or modified acquisition parameter related operating options that in this case are provided for a set of a plurality of acquisition parameter menus. The acquisition parameter menus are used for setting acquisition protocols that comprise at least one magnetic resonance sequence and are used for acquiring magnetic resonance data by means of the magnetic resonance device. More precisely, acquisition parameters are thus set via the acquisition parameter menus as user interfaces, in particular with embodiments also being conceivable in which lower-level acquisition parameters, for instance specific sequence parameters, are derived from higher-level acquisition parameters, for instance a resolution.

Figure 2:
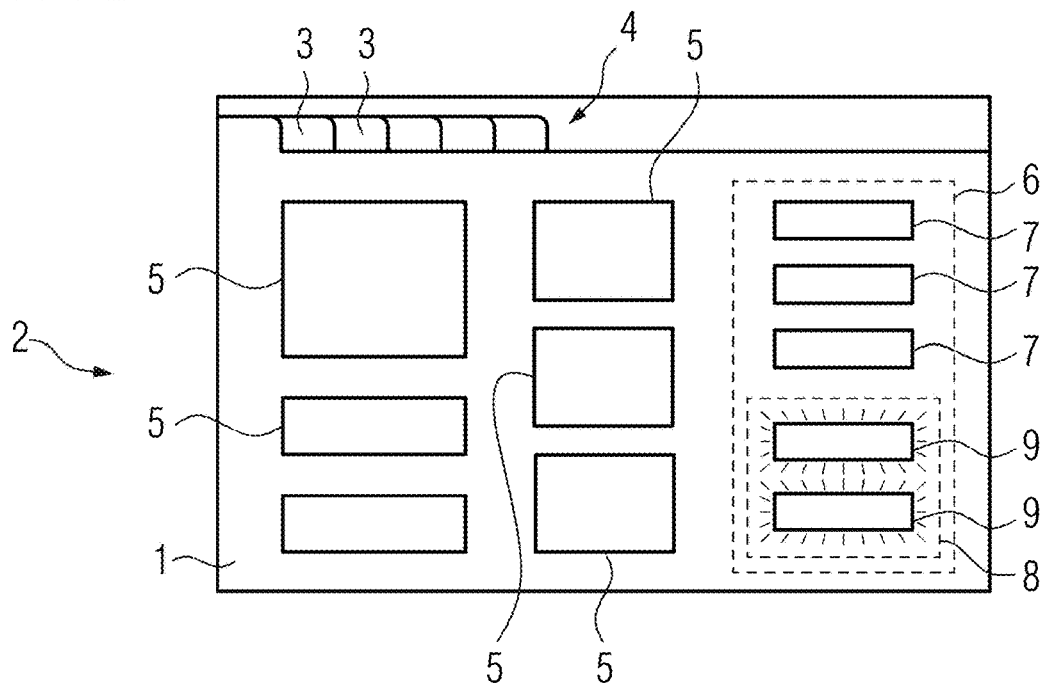
FIG. 2 shows a first exemplary user interface.

If the function for setting the acquisition parameters, i.e. the set of acquisition parameter menus, is invoked from another user interface, a main acquisition parameter menu 1 as the first, most important acquisition parameter menu is displayed first as the user interface 2, as shown in FIG. 2. The tabs 3 here stand for further, other acquisition parameter menus 4. The main acquisition parameter menu 1, which in exemplary embodiments may also differ according to a selected desired acquisition protocol, can contain operating options and/or information elements 5 specified on a right-hand side, for example. On the left-hand side, the main acquisition parameter menu 1 contains a configuration area 6, which a user can fill with user-selected operating options 7. Of course, the display in FIG. 2 is intended purely by way of example, and embodiments are also conceivable in which the main acquisition parameter menu 1 is user-configurable to a greater extent or even entirely.

In the present case, a view area 8, for example the still unoccupied portion of the configuration area 6, is used to display newly available and/or modified acquisition parameter related operating options 9 in the main acquisition parameter menu 1 in a highlighted manner, as indicated. This is regardless of whether the generally specified position of the acquisition parameter related operating options 9 was placed in the main acquisition parameter menu 1 or in another acquisition parameter menu 4 (default acquisition parameter menu). If the corresponding other acquisition parameter menu 4 is invoked via the corresponding tab 3, the corresponding acquisition parameter related operating option 9 is also displayed there in a highlighted manner.

Newly added and/or modified operating options are thereby displayed automatically on the first acquisition parameter menu that is shown, namely the main acquisition parameter menu 1. The user is notified of the existence/modification, and can then decide whether the particular acquisition parameter related operating option 9 is meant to remain there permanently or whether it is removed from there again.

In particular in the second case, an embodiment is expedient in which on detection of a predefined user interaction with the operating option 9 displayed in a highlighted manner, for instance selecting an item in a context menu, the assigned other acquisition parameter menu 4 (default acquisition parameter menu) is opened automatically, so that a user is still informed of where to find the operating option 9, for instance if they remove it from the main acquisition parameter menu 1.

Whereas the display in the special view area 8 can be understood in general to be highlighting, additional or alternative types of highlighting are preferably conceivable according to the disclosure, including for newly available and/or modified operating options other than acquisition parameter related operating options. For example, newly available and/or modified operating options can be provided with a colored border, in which case the color and/or the shape of the border can also be configured to be dynamic, for instance to pulsate or flash. A background is also conceivable, as is assigning lettering and/or an icon or other symbols. It is also possible, for example, to use a tool tip that is continuously active for the duration of the highlighting.

Figure 3:
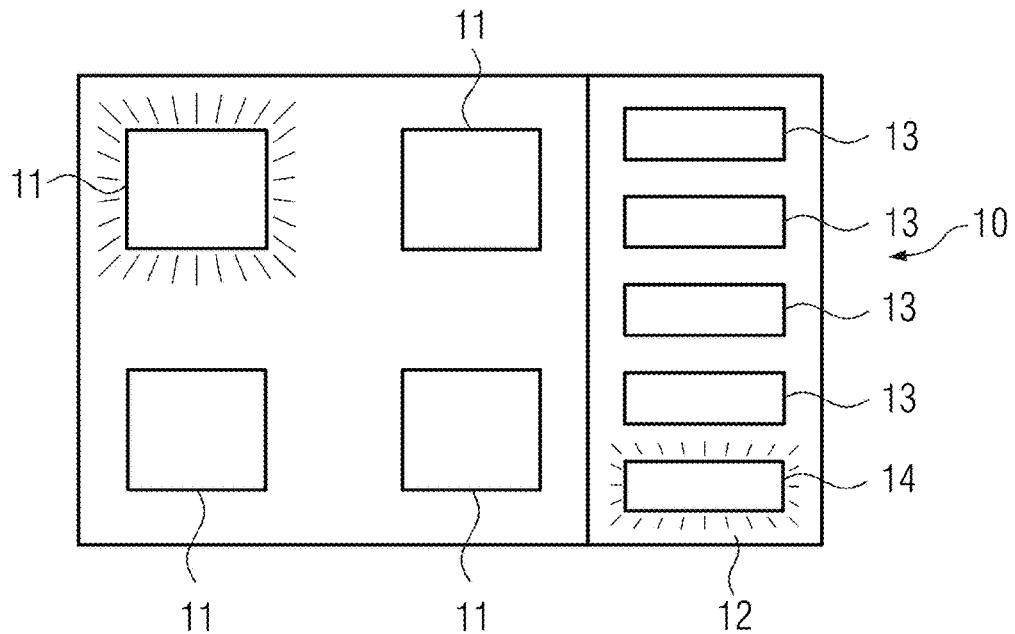
FIG. 3 shows a second exemplary user interface.

Further possible ways of visualizing the change information are shown in FIG. 3 using the example of a further user interface 10, for instance a type of main menu, in which further user interfaces or user interface groups such as the acquisition parameter menus 1, 4 can be selected via operating options 11. For example, in this case, one of the operating options 11 that leads to the acquisition parameter menus 1, 4 is highlighted in order to show that newly added and/or modified operating options 9 are present there. On the left-hand side of the user interface 10 is also provided a favorites view area 12 for operating options 13, for instance selection buttons, assigned to user-preferred tools. If the latest update now adds also a newly available and/or modified operating option 14 that relates to such a tool, the operating option 14 is displayed in a highlighted manner in the favorites view area 12 regardless of the user preference.

Of course, other possibilities and cases relating to newly available and/or modified operating options 9, 14 and user interfaces are also conceivable beyond the examples shown here.

Figure 4:
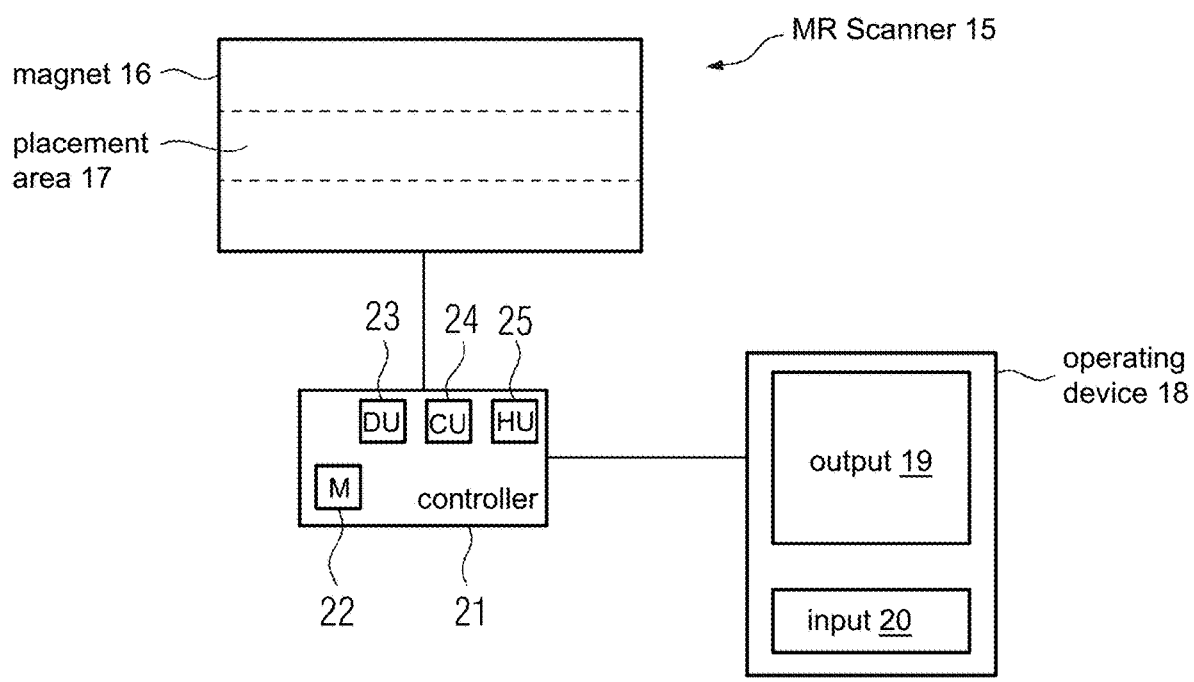
FIG. 4 shows a block diagram of a magnetic resonance device according to the disclosure.

Lastly, FIG. 4 shows a block diagram of a magnetic resonance (MR) device (MR scanner) 15 according to the disclosure. This comprises, as is generally known, a main magnetic unit 16, which here is cylindrical and defines in its interior a patient placement area 17, into which a patient can be moved using a patient couch (not shown here) in order to acquire magnetic resonance data. Also shown is an operator device 18 having at least one output means 19 (e.g. display screen) and an input means (e.g. keyboard) 20, at least part of which operator device can also be provided on the main magnetic unit 16. Output means 19 and input means 20 can also be integrated with one another, for instance in the form of a touchscreen, which can be provided, for example, on an end face of the main magnetic unit 16. The operating device 18 may be a computer (e.g. laptop or other general-purpose computer), mobile device (e.g. a mobile communication device, tablet), or other electronic device as would be understood by one of ordinary skill in the art. In an exemplary embodiment, the operator device 18 (and/or one or more components therein) includes processing circuitry that is configured to perform one or more functions and/or operations of the operator device 18.

The operation of the magnetic resonance device 15 is controlled by a controller 21, which is configured also to implement the method according to the disclosure. In addition to a storage means (memory) 22, the controller 21 can comprise for this purpose, for example, an optional determination unit 23 for determining, if provided, the change information from the update information, or alternatively also an interface for receiving the change information (each case relates to step S2). In a checking unit 24, the criteria can be checked in accordance with step S4, while the highlighting can take place according to step S5 in a highlighting unit 25. In an exemplary embodiment, the controller 21 includes processing circuitry that is configured to perform one or more functions and/or operations of the controller 21, including controlling the MR device 15 (and/or one or more components therein), processing magnetic resonance signals, reconstructing magnetic resonance images, processing input from the operating device 18, and/or providing an output via the operating device 18.

Although the disclosure has been illustrated and described in detail using the exemplary embodiment, the disclosure is not limited by the disclosed examples, and a person skilled in the art can derive other variations therefrom without departing from the scope of protection of the disclosure.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others.

Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for operating a magnetic resonance device having an operator device configured for the input of at least one operating parameter, at least one output, and a controller configured to control the magnetic resonance device based on the at least one operating parameter, the operator device being driven to display at least one user interface on the output in accordance with user interface software of the controller, the method comprising:
determining change information based on received update information for updating the user interface software, the determined change information identifying newly available and/or modified operating options compared with previous version of the user interface software for one or more of the at least one user interface; and
controlling the output of the operator device based on the change information to highlight the newly available and/or modified operating options and display, in a highlighted manner, the newly available and/or modified operating options at least in response to the one or more of the at least one user interface and/or a further user interface of the at least one user interface, which is assigned based on the change information, being invoked for a first time.

2. The method as claimed in claim 1, further comprising displaying, in a highlighted manner:
the at least one user interface for which at least one newly available and/or modified operating option is ready, in at least one higher-level user interface in which it can be invoked, and/or
the at least one user interface from which can be invoked the at least one user interface for which at least one newly available and/or modified operating option is ready, in at least one higher-level user interface in which it can be invoked.

3. The method as claimed in claim 1, wherein the change information is assigned at least one user-modifiable, time-length criterion, the highlighted display taking place after the first invocation of the corresponding user interface only in response to the time-length criterion being fulfilled.

4. The method as claimed in claim 3, wherein the user-modifiable, time-length criterion comprises:
a maximum number of invocations of the user interface and/or of the operating option; and/or
a maximum timespan after the update.

5. The method as claimed in claim 1, wherein at least one acquisition parameter related operating option of the at least one new and/or modified operating option relates to setting an acquisition parameter for an acquisition process of the magnetic resonance device as an operating parameter, the acquisition parameter related operating option being assigned to at least one acquisition parameter menu as a user interface of the at least one user interface.

6. The method as claimed in claim 5, further comprising providing a plurality of acquisition parameter menus, wherein a main acquisition parameter menu of the acquisition parameter menus is displayed first on selection of a function for setting acquisition parameters, and, irrespective of a specified assignment of the at least one acquisition parameter related operating option to another of the acquisition parameter menus, according to the change information, the at least one acquisition parameter related operating option is displayed in a highlighted manner in the main acquisition parameter menu in a predefined view area.

7. The method as claimed in claim 6, wherein the at least one acquisition parameter related operating option is removed again from the main acquisition parameter menu on detection of a specified operating action.

8. The method as claimed in claim 6, wherein, on detection of a predefined user interaction, with one of the at least one acquisition parameter related operating option displayed in a highlighted manner in the main acquisition parameter menu, the other acquisition parameter menu, for which the at least one acquisition parameter related operating option is intended, and the at least one acquisition parameter related operating option are displayed in a highlighted manner.

9. The method as claimed in claim 6, further comprising, in addition to the highlighted display in the main acquisition parameter menu, displaying the at least one acquisition parameter related operating option in a highlighted manner in the other of the acquisition parameter menus.

10. The method as claimed in claim 7, wherein the main acquisition parameter menu: is user-configured, and/or has at least one operating option for setting a higher-level acquisition parameter that affects a plurality of sequence parameters of a magnetic resonance sequence.

11. The method as claimed in claim 6, further comprising analyzing usage information describing past usage behavior with regard to the at least one acquisition parameter menu to determine at least some other operating options to be displayed on the main acquisition parameter menu of the acquisition parameter menus.

12. The method as claimed in claim 1, wherein at least one of the at least one newly available and/or modified operating options relates to a tool, which is shown in a highlighted manner in a favorites view area for user-preferred tools that is user-configurable.

13. The method as claimed in claim 1, wherein the highlighting is performed by using: a border, coloration, a background, lettering, and/or dynamically by pulsating and/or flashing.

14. A computer program product which includes a program and is directly loadable into a memory of a controller, when executed by a processor of the controller, causes the processor to perform the method as claimed in claim 1.

15. A non-transitory computer-readable storage medium with an executable program stored thereon, that when executed, instructs a processor to perform the method of claim 1.

16. A magnetic resonance device, comprising:
an operator device including an input interface that is configured to receive input of at least one operating parameter and an output interface; and
a controller configured to:
control the magnetic resonance device based on the at least one operating parameter set by the operator device;
drive the operator device to display at least one user interface on the output based on user interface software;
determining change information based on received update information for updating the user interface software, the determined change information identifying newly available and/or modified operating options compared with previous version of the user interface software for one or more of the at least one user interface; and
controlling the output of the operator device based on the change information to highlight the newly available and/or modified operating options to display, in a highlighted manner, the newly available and/or modified operating options at least in response to the one or more of the at least one user interface and/or a further user interface of the at least one user interface, which is assigned based on the change information, being invoked for a first time.

* * * * *